United States Patent [19]

Kato et al.

[11] Patent Number: 4,828,949

[45] Date of Patent: May 9, 1989

[54] METHOD FOR MANUFACTURING A PHOSPHOR PATTERN USING PHOSOSENSITIVE PHOSPHOR PASTE LAYER OF HIGH VISCOSITY

[75] Inventors: Hiroshi Kato, Kanagawa; Reiko Saito, Saitama, both of Japan

[73] Assignee: Sony Corporation, Tokyo, Japan

[21] Appl. No.: 52,164

[22] Filed: May 19, 1987

Related U.S. Application Data

[63] Continuation of Ser. No. 772,927, Sep. 5, 1985, abandoned.

[30] Foreign Application Priority Data

Sep. 6, 1984 [JP] Japan ............................. 59-187078

[51] Int. Cl.⁴ ........................... G03C 5/00; B05D 3/06
[52] U.S. Cl. ................................ 430/28; 430/23; 430/25; 430/26; 430/289; 427/68
[58] Field of Search ............... 430/25, 26, 28, 289, 430/23; 427/68

[56] References Cited

U.S. PATENT DOCUMENTS

| | | | |
|---|---|---|---|
| 2,916,376 | 12/1959 | Ritter et al. | 430/289 |
| 2,959,483 | 11/1960 | Kaplan | 430/28 |
| 3,380,826 | 4/1968 | Deary et al. | 430/28 |
| 3,406,068 | 10/1968 | Law | 430/269 |
| 4,020,191 | 4/1977 | Nagashiro et al. | 430/311 |
| 4,035,524 | 7/1977 | Fritsch | 427/68 |
| 4,049,452 | 9/1977 | Nekut | 430/28 |
| 4,052,519 | 10/1977 | Prazak | 427/68 |
| 4,254,197 | 3/1981 | Miura et al. | 430/28 |
| 4,255,504 | 3/1981 | Hakala | 430/28 |
| 4,339,524 | 7/1982 | Ichimura et al. | 430/28 |
| 4,546,064 | 10/1985 | Lambert et al. | 430/28 |

FOREIGN PATENT DOCUMENTS 1113203 5/1968 United Kingdom .
1472037 4/1977 United Kingdom .

*Primary Examiner*—Charles L. Bowers, Jr.
*Attorney, Agent, or Firm*—Hill, Van Santen, Steadman & Simpson

[57] ABSTRACT

A method for manufacturing a phosphor screen is disclosed, which includes the steps of coating a photo-sensitive phosphor paste on a necessary portion, exposing the coated photo-sensitive phosphor paste through a photo-mask, and developing the exposed phosphor paste thereby to form a phosphor stripe. Also, a photo-sensitive phosphor paste is disclosed, in which at least one glycol selected from glycol groups of 1, 2-propanediol, 1, 3-propanediol, 1, 3-butanediol, 2-methyl-2, 4-pentanediol and so on is contained with a weight ratio of 0.1 to 2.0 relative to a solid component of polyvinyl alcohol.

3 Claims, 2 Drawing Sheets

4,828,949

METHOD FOR MANUFACTURING A PHOSPHOR PATTERN USING PHOSOSENSITIVE PHOSPHOR PASTE LAYER OF HIGH VISCOSITY

This is a continuation of application Ser. No. 772,927, filed Sept. 5, 1985, now abandoned.

BACKGROUND OF THE INVENTION

1. Field of the Invention

The present invention relates to a method for manufacturing a phosphor screen which is suitable for making a color cathode ray tube having a face plate of, for example, flat plate-shape and to a photo-sensitive phosphor paste which is used to carry out the above manufacturing method of the cathode ray tube.

2. Description of the Prior Art

Recently, a requirement for a cathode ray tube which has a phosphor screen coated on a plate glass of perfectly flat plate-shape is increased. Such cathode ray tube has already been put into practical use as a monochromatic tube which is used as a projector or the like. One of the features of such cathode ray tube is as follows: Since an image is displayed on a perfectly flat plate glass, the image is free from an optical distortion and this cathode ray tube is very suited for a display apparatus of high efficiency and so on. For this reason, such a cathode ray tube is naturally desired as a color cathode ray tube.

The cathode ray tube in which the phosphor screen is formed on the plate glass of flat plate-shape has no skirt portion unlike a prior art panel, so if the phosphor screen thereof is formed by the prior art manufacturing method, i.e., a so-called slurry method, much phosphor slurry will be lost unnecessarily, while when a stripe and so on are printed on the flat glass plate by a photographic technique, slurry will adhere to a reference plane portion. Therefore, it has been considered to employ the screen printing method. In this case, however, since the screen printing method is low in accuracy, it is almost impossible to directly print the phosphor stripe which needs accuracy of micron order.

OBJECTS AND SUMMARY OF THE INVENTION

Accordingly, it is an object of this invention to provide a method for manufacturing a phosphor screen of a cathode ray tube which can reduce the amount of phosphor to be used and which can remove the possibility that the phosphor will adhere to a reference plane.

It is another object of this invention to provide a method for manufacturing a phosphor screen of a cathode ray tube which can form a phosphor stripe with high accuracy.

It is a further object of this invention to provide a photo-sensitive phosphor paste which is directly used in the manufacturing method of the present invention.

According to one aspect of this invention, there is provided a method for manufacturing a phosphor screen comprising the steps of:

(a) coating photo-sensitive phosphor paste on a predetermined portion;

(b) exposing the coated photo-sensitive phosphor paste through a photo-mask; and (c) developing said exposed phosphor paste thereby to form a phosphor stripe.

According to another aspect of this invention, there is further provided a photo-sensitive phosphor paste characterized in that at least one glycol selected from glycols groups of 1,2-propanediol, 1,3-propanediol, 1,3-butanediol, 2-methyl-2,4-pentanediol and so on is contained with a weight ratio of 0.1 to 2.0 relative to a solid component of polyvinyl alcohol.

These and other objects, features and advantages of the present invention will become apparent from the following detailed description of the preferred embodiments taken in conjunction with the accompanying drawings, throughout which like reference numerals designate like elements and parts.

DESCRIPTION OF THE PREFERRED EMBODIMENTS

Now, embodiments of the invention will hereinafter be described with reference to the attached drawings.

Figure 1:
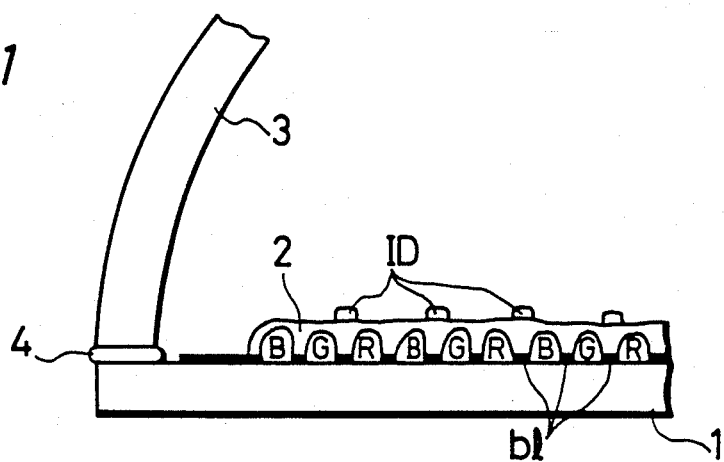
FIG. 1 is a cross-sectional view of a main part of a beam index type cathode ray tube to which the present invention is applied.

FIG. 1 is a cross-sectional view illustrating a main part of a beam index-type cathode ray tube to which the present invention is applied. In FIG. 1, reference numeral 1 designates a face plate of the cathode ray tube made of a glass plate with a perfectly flat plate-shape. On the face plate 1, there are formed carbon stripes bl between which red, green and blue phosphor stripes R, G and B are formed in turn. On the red, green and blue phosphor stripes R, G and B, there is formed an aluminum (Al) film 2 as a metal back film on which an index phosphor stripe ID is further formed. Reference numeral 3 designates a funnel portion of the cathode ray tube and this funnel portion 3 is sealed on the end portion of the face plate 1 by a frit glass 4.

The color phosphor stripes R, G and B are respectively formed by the manufacturing processes ① to ④ shown in FIGS. 2A to 2D after the carbon stripes bl are formed.

Figure 2A:
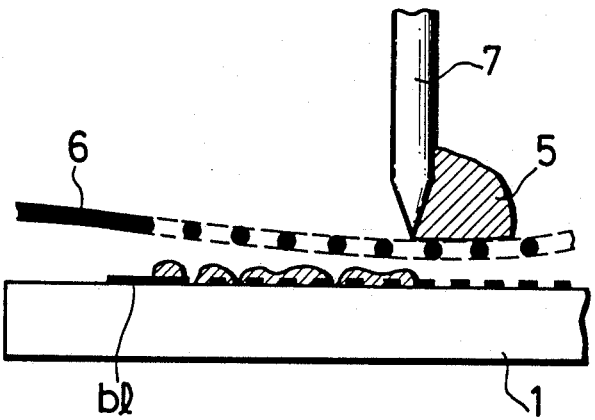
FIGS. 2A to 2D are respectively diagrams showing manufacturing processes of a phosphor stripe according to the present invention.

① As shown in FIG. 2A, a photo-sensitive phosphor paste 5 containing, for example, blue phosphor is coated only on the predetermined portions over the carbon stripes bl by the printing method. In FIG. 2A, reference numeral 6 designates a screen mesh and reference numeral 7 designates a squeegee. As the screen mesh 6, such one whose mesh size is, for example, #150 or more may be used.

Figure 2B:
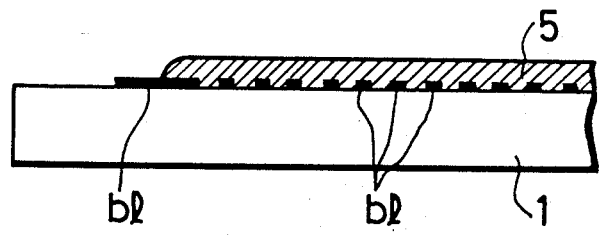

② As shown in FIG. 2B, after the photo-sensitive phosphor paste 5 was coated on the carbon stripes bl, the face plate 1 is left as it is for the phosphor paste 5 to be levelled so as not to expose the printed mesh mark and then the phosphor paste 5 is dried.

Figure 2C:
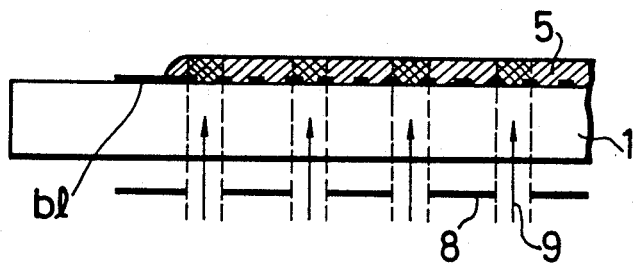

③ As shown in FIG. 2C, the photo-sensitive phosphor paste 5, particularly its portions where the blue phosphor stripes B should be formed are exposed through a photo-mask 8 by ultraviolet rays 9 and the exposed portions of the phosphor paste 5 are cured.

Figure 2D:
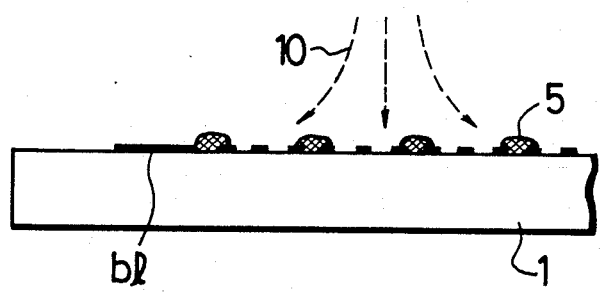

④ As shown in FIG. 2D, the photo-sensitive phosphor paste 5 is developed by water 10, resulting in the removal of the unexposed phosphor paste while leaving the blue phosphor stripes B.

The blue phosphor stripe B is formed as described above. The red and green phosphor stripes R and G are similarly formed by the above manufacturing processes ①  to ④, respectively.

Further, in FIG. 1, the index phosphor stripe ID that is formed on the aluminum film 2 is also formed similarly in accordance with the above manufacturing processes ① to ④.

As the photo-sensitive phosphor paste used to form the phosphor stripe, such one which will satisfy the following conditions ⓐ to ⓔ is used.

ⓐ From the standpoint of circumstances, cost and so on, like the PVA (polyvinyl alcohol)-ADC (ammonium dichromate) system, the photo-sensitive phosphor paste which can be developed by water is used.

ⓑ From a viewpoint of dark reaction, in the case of, for example, the PVA-ADC system, it can be dried at a temperature lower than 45° C.

ⓒ The photo-sensitive phosphor paste should have such viscosity and evaporation speed enough to be levelled so as not to produce a printed mesh mark.

ⓓ The phosphor paste can provide a predetermined film thickness and a predetermined bonding strength of stripes.

ⓔ When the color phosphor is formed, the phosphor paste must not be mixed into other color phosphors, etc.

In order to provide the viscosity and evaporation speed necessary for carrying out the levelling, the photo-sensitive phosphor paste contains a predetermined weight ratio of glycol relative to the solid component of the PVA. As the glycol, it is possible to use 1,2-propanediol, 1,3-propanediol, 1,3-butanediol, 2-methyl-2,4-pentanediol and so on as shown in the table 1 below. Whereas, ethylene glycol, 1,2-butanediol, glycerin and the like can not be used because of the conditions as mentioned above. More specifically, if ethylene glycol is used, due to the increase in the sensitivity of the PVA-ADC system photo-sensitive liquid, the phosphor paste acquires a strong temperature dependency, if the 1,2-butanediol is used, the paste becomes poor in mixing property relative to the water; and if glycerin is used, the paste becomes poor in bonding property. Particularly, since the 2-methyl-2,4-pentanediol is low in corrosion property for metal, it is suitable to form the index phosphor stripe ID on the aluminum film 2.

TABLE 1

| | Name of Glycol | chemical structure | whether used or not | Problem |
|---|---|---|---|---|
| 1 | ethylene glycol | HO—CH₂—CH₂—OH | no | Sensitivity of PVA-ADC system photo-sensitive liquid was increased. |
| 2 | 1,2-propanediol (propylene glycol) | HO—CH₂—CH(OH)—CH₃ | usable | |
| 3 | 1,3-propanediol (trimethylene glycol) | HO—CH₂—CH₂—CH₂—OH | usable | |
| 4 | 1,2-butanediol | HO—CH₂—CH(OH)—CH₂—CH₃ | no | poor in mixing property to water. |
| 5 | 1,3-butanediol | HO—CH₂—CH(OH)—CH₂—CH₃ | usable | |
| 6 | 2-methyl-2,4-pentanediol | (CH₃)₂C(OH)—CH₂—CH(OH)—CH₃ | usable | |
| 7 | glycerin | HOCH₂—CH(OH)—CH₂OH | no | bad in bonding property. |

Figure 3:
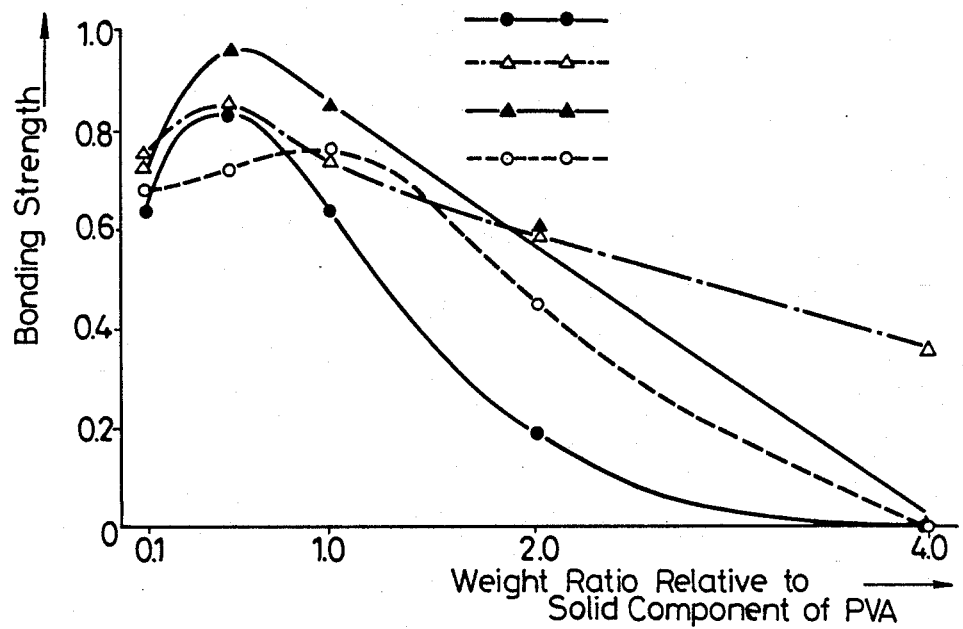
FIG. 3 is a characteristic graph showing the relation between a bonding strength and a weight ratio of glycol.
Figure 4:
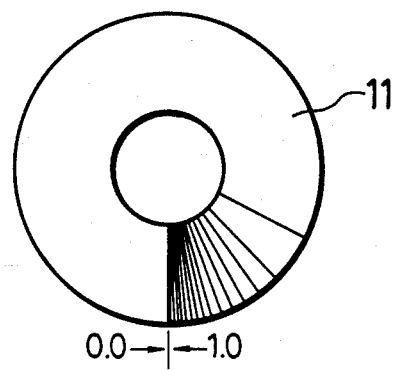
FIG. 4 is a plan view illustrating an example of a wedge filter used for measuring the relation of FIG. 3.

Further, the weight ratio of glycol relative to the solid component of PVA is selected to be in a range from 0.1 to 2.0, by way of example. If the weight ratio becomes lower than 0.1, the coated surface gets rough and a bubble can not disappear from the surface, or the levelling effect is lost, while if it becomes higher than 2.0, the glycol does not get dried and the bonding strength becomes insufficient. FIG. 3 is a graph showing the relation between the weight ratio of glycol relative to the solid component of PVA and the bonding strength by using a wedge filter 11 shown in FIG. 4.

The wedge filter 11 comprises continuous portions from a portion (1.0) which does not allow the ultraviolet rays to pass therethrough at all to a portion (0.0) which allows the same to pass therethrough thoroughly and the bonding strength is measured by examining the portion of the wedge filter 11 by the ultraviolet rays passing through which the paste is cured. In this case, the temperature at the panel was 40° C. From FIG. 3, it will be seen that if the weight ratio becomes higher than 2.0, the bonding strength is lowered considerably.

A table 2 below indicates an example of composition of photo-sensitive phosphor paste that is used to form the blue phosphor stripe B. In this case, as the blue phosphor, 100 g of ZnS:Ag is used and there are used 8 g of polyvinyl alcohol (PVA), for example, GOTHENOL EG-40 (product name, manufactured by Nippon Synthetic Chemical Industry Co., Ltd.), 55 ml of water, 0.3 g of ammonium dichromate (ADC), 0.1 to 1 ml of octyl alcohol as a defoaming agent, 2 ml of coloidal silica, for example, LUDOX AM (product name, manufactured by The Dupont Company) as an agent for increasing the bonding strength, and 2 g of 1,3-propanediol. When this photo-sensitive phosphor paste is used, as the screen mesh for printing, for example, a stainless steel with the mesh size of #200 is used.

A table 3 below indicates an example of the composition of photo-sensitive phosphor paste used to form the index phosphor stripe ID. In this case, 50 g of $Y_3Al_5O_{12}$:Ce is used as an index phosphor, and also there are used 15 g of polyvinyl alcohol (PVA), for example, GOTHENOL EG-40, 100 ml of water, 0.5 g of ammonium dichromate (ADC), 2.0 ml of octyl alcohol as the defoaming agent, 4 ml of coloidal silica, for example, LUDOX AM as the agent for increasing the bonding strength and 5 g of 2-methyl-2,4-pentanediol.

TABLE 2

| Phosphor (ZnS:Ag) | 100 g |
|---|---|
| Polyvinyl alcohol (PVA) [GOTHENOL EG - 40] | 8 g |
| Water | 55 ml |
| ammonium dichromate (ADC) | 0.3 g |
| octyl alcohol | 0.1 to 1 ml |
| coloidal silica [LUDOX AM] | 2 ml |
| 1, 3-propanediol | 2 g |

TABLE 2

| Phosphor($Y_3Al_5O_{12}$:Ce) | 50 g |
|---|---|
| Polyvinyl alcohol (PVA) [GOTHENOL EG - 40] | 15 g |
| Water | 100 ml |
| ammonium dichromate (ADC) | 0.5 g |
| octyl alcohol | 2 ml |
| coloidal silica [LUDOX AM] | 4 ml |
| 2-methyl-2, 4-pentanediol | 5 g |

As set forth above, according to the method for manufacturing a phosphor screen of the present invention, in order to form the phosphor stripe, since the photo-sensitive phosphor paste is coated at first and the phosphor paste is coated only on the predetermined portion, as compared with the prior art slurry method, the used amount of the phosphor can be reduced. Further, since there is no fear that such phosphor paste will adhere to the reference surface, the treatment for removing the material adhered thereto and so on become unnecessary. Further, as compared with the prior art slurry method, the apparatus therefor becomes simple in construction and becomes suitable for mass-production. Further, according to the manufacturing method of the present invention, since the photo-sensitive phosphor paste is exposed and then developed thereby to form the phosphor stripe, the phosphor stripe can be formed with high precision.

Furthermore, since the photo-sensitive phosphor paste of the present invention contains glycol with a predetermined weight ratio relative to the solid component of PVA and the glycol functions as a drying retarder or inhibitor, upon printing, for example, the predetermined viscosity and evaporation speed and so on can be obtained. Thus this photo-sensitive phosphor paste is very suitable for carrying out the above manufacturing method of this invention.

The above description is given on the preferred embodiments of the invention but it will be apparent that many modifications and variations could be effected by one skilled in the art without departing from the spirits or scope of the novel concepts of the invention, so that the scope of the invention should be determined by the appended claims only.

We claim as our invention:

1. A method of manufacturing a phosphor pattern on a cathode ray tube panel comprising the steps of:

coating a photo-sensitive phosphor paste layer wherein the layer comprises ammonium dichromate and a phosphor pigment and having a polyvinyl alcohol base and a drying retarding glycol onto the inner surface of said panel by printing the paste through a mesh screen to produce a coated paste layer, providing the photo-sensitive phosphor paste layer with a sufficiently high viscosity and evaporation speed to be leveled without a printed mesh mark, leveling said coating paste layer after such coating to prevent a printed mesh mark of the mesh screen from remaining on said coated paste, exposing the printed photo-sensitive phosphor paste layer to radiation through a photo-mask having the desired phosphor pattern formed thereon to form discrete exposed areas having said desired phosphor pattern while leaving unexposed areas therebetween, and developing the exposed area with water to thereby separate the unexposed areas from the exposed areas constituting the desired phosphor pattern.

2. A method according to claim 1 wherein said paste contains at least one glycol from the following group: 1,2-propanediol; 1,3-propanediol; 1,3-butanediol; and 2-methyl-2,4-pentanediol, said glycol being present in an amount of from 0.1 to 2.0 parts by weight for each part by weight of solid polyvinyl alcohol.

3. A method according to claim 2 in which said paste also contains a defoaming agent.

* * * * *